US012621622B2

(12) United States Patent
 Xu et al.

(10) Patent No.: US 12,621,622 B2
(45) Date of Patent: May 5, 2026

(54) SYSTEM AND METHOD FOR VERIFYING POWER AMPLIFIER OF ON-BOARD AUDIO SYSTEM

(71) Applicant: SUZHOU SONAVOX ELECTRONICS CO., LTD., Suzhou (CN)

(72) Inventors: Yongshuang Xu, Suzhou (CN); Xianzhi Peng, Suzhou (CN); Hongying Feng, Suzhou (CN); Guoqiang Chai, Suzhou (CN)

(73) Assignee: Suzhou Sonavox Electronics Co., Ltd., Suzhou (CN)

( * ) Notice: Subject to any disclaimer, the term of this patent is extended or adjusted under 35 U.S.C. 154(b) by 312 days.

(21) Appl. No.: 18/556,610

(22) PCT Filed: Dec. 27, 2021

(86) PCT No.: PCT/CN2021/141657
§ 371 (c)(1),
(2) Date: Oct. 20, 2023

(87) PCT Pub. No.: WO2022/222534
PCT Pub. Date: Oct. 27, 2022

(65) Prior Publication Data
US 2024/0373185 A1 Nov. 7, 2024

(30) Foreign Application Priority Data
Apr. 23, 2021 (CN) .......................... 202110440884.2

(51) Int. Cl.
*H04S 3/00* (2006.01)
*G06F 3/16* (2006.01)
(Continued)

(52) U.S. Cl.
CPC .............. *H04S 3/008* (2013.01); *G06F 3/162* (2013.01); *H03F 3/21* (2013.01); *H04S 7/301* (2013.01);
(Continued)

(58) Field of Classification Search
CPC ...... H04S 3/008; H04S 7/301; H04S 2400/01; H04R 29/001; H04R 3/00; H04R 2499/13; H03F 3/21; H03F 2200/03; G01R 31/2825
See application file for complete search history.

(56) References Cited

U.S. PATENT DOCUMENTS 9,247,345 B2 * 1/2016 Hogan ................. H04R 29/001
2009/0060212 A1 * 3/2009 Deng .................... H04R 29/00
381/58
2009/0274311 A1 11/2009 Siew et al.

FOREIGN PATENT DOCUMENTS

CN 103747405 A 4/2014
CN 206181379 U 5/2017
CN 113301487 A 8/2021

OTHER PUBLICATIONS

International Search Report and Written Opinion issued for International Patent Application No. PCT/CN2021/141657, dated Mar. 18, 2022 including English translation of ISR in 15 pages.

* cited by examiner

*Primary Examiner* — Jason R Kurr
(74) *Attorney, Agent, or Firm* — Knobbe, Martens, Olson & Bear, LLP

(57) ABSTRACT
Disclosed are a system and method for verifying a power amplifier of a vehicular audio system. The system includes: a TDM converter for converting an audio signal into a TDM signal; an audio signal processor for receiving the TDM signal and generating and outputting a test signal for trans-
(Continued)

mitting to the power amplifier, the audio signal processor having N audio channels, N>1; a channel configurator having M configuration units, M≥N, each of the audio channels corresponding to one of the configuration units, and each of the configuration units having a selected state and a non-selected state; and a controller for determining that each of the configuration units is in the selected state or non-selected state and controlling the audio signal processor to place the TDM signal in audio channel(s) corresponding to configuration unit(s) in the selected state.

15 Claims, 2 Drawing Sheets

(51) Int. Cl.
    *H03F 3/21*          (2006.01)
    *H04S 7/00*         (2006.01)
(52) U.S. Cl.
    CPC ...... *H03F 2200/03* (2013.01); *H04R 2499/13*
                (2013.01); *H04S 2400/01* (2013.01)

SYSTEM AND METHOD FOR VERIFYING POWER AMPLIFIER OF ON-BOARD AUDIO SYSTEM

CROSS-REFERENCE TO RELATED APPLICATIONS

This application is the U.S. National Phase under 35. U.S.C. § 371 of International Application PCT/CN2021/141657, filed Dec. 27, 2021, which claims priority from Chinese Patent Application No. CN 202110440884.2 filed on Apr. 23, 2021. The disclosures of the above-described applications are hereby incorporated by reference in their entirety.

FIELD OF TECHNOLOGY

The present disclosure relates to the field of power amplifiers of vehicular audio systems, specifically to a system and method for verifying a power amplifier of a vehicular audio system.

BACKGROUND

For vehicular audio systems, audio transmission is becoming increasingly diverse, such as it may be needed to transmit multimedia stereo sound, 5.1 channel audio signals, 7.1 channel audio signals, alarm sound, VR, Bluetooth telephone audio signals, and other audio signals. Most of the vehicular entertainment systems utilize a TDM audio bus to transmit multi-channel audio data. Due to the fact that the TDM (time-division multiplexing) bus is an $I^2S$ (Inter-IC Sound) like audio bus, consisting of three wires: BCLK, LRCLK, and DATA, it is necessary to verify the functionality of each channel of the power amplifier in actual production and testing processes for multi-channel audio transmission. At present, when verifying power amplifiers, it is necessary to input a standard signal to each channel and perform functional verification on each channel.

SUMMARY

The present disclosure provides a system and method for verifying a power amplifier of a vehicular audio system, which can simply and quickly verify the function of the power amplifier for use in the vehicular audio system.

An aspect of the present disclosure relates to a system for verifying a power amplifier of a vehicular audio system, including:

- a TDM converter for converting an audio signal into a TDM signal;
- an audio signal processor for receiving the TDM signal and generating and outputting a test signal for transmitting to the power amplifier, the audio signal processor having N audio channels, N>1;
- a channel configurator having M configuration units, M≥N, each of the audio channels corresponding to one of the configuration units, and each of the configuration units having a selected state and a non-selected state; and
- a controller for determining that each of the configuration units is in the selected state or non-selected state and controlling the audio signal processor to place the TDM signal in the audio channel(s) corresponding to the configuration unit(s) in the selected state.

In an embodiment, each of the configuration units comprises a dial switch, and when the dial switch is switched off, the configuration unit is in the selected state.

In an embodiment, each of the configuration units further comprises a first resistor, a first end of the first resistor is electrically connected to a voltage input terminal, a second end of the first resistor is electrically connected to a first end of the dial switch, and a second end of the dial switch is electrically connected to the controller. Further, the voltage input terminal has an access voltage of 3.3 V.

In an embodiment, each of the configuration units further comprises a second resistor, a first end of the second resistor is grounded, a second end of the second resistor is electrically connected to an intermediate node of the second end of the dial switch and the controller.

In an embodiment, the controller comprises a plurality of I/O ports, and the second end of each dial switch is electrically connected to one of the I/O ports.

In an embodiment, the controller is electrically connected to the audio signal processor via a UART bus.

In an embodiment, the controller is an MCU chip.

In an embodiment, the audio signal processor is a DSP chip.

In an embodiment, the verification system further comprises an A2B bus for transmitting an output of the DSP chip to the power amplifier.

In an embodiment, the verification system further comprises an audio input module electrically connected to the TDM converter.

In an embodiment, the TDM converter, the audio signal processor, the channel configurator, and the controller are arranged on a PCB board.

In an embodiment, the PCB board is provided with an input port for inputting audio, and the input port is electrically connected to the TDM converter.

In an embodiment, each of the configuration units comprises a dial switch, and when the dial switch is switched off, the configuration unit is in the selected state; each of the configuration units further comprises a first resistor, a first end of the first resistor is electrically connected to a voltage input terminal, a second end of the first resistor is electrically connected to a first end of the dial switch, and a second end of the dial switch is electrically connected to the controller; each of the configuration units further comprises a second resistor, wherein a first end of the second resistor is grounded, a second end of the second resistor is electrically connected to an intermediate node of the second end of the dial switch and the controller.

A second aspect of the present disclosure relates to a method of verifying for a power amplifier of an vehicular audio system, which utilizes the verification system as described above, and which comprises steps of: according to the one or more audio channels that need to be tested, setting corresponding one or more configuration units to the selected state, and controlling the audio signal processor via the controller to place the TDM signal in the audio channel(s) corresponding to the configuration unit(s) in the selected state.

In an embodiment, the configuration unit(s) are set to the selected state by switching off the dial switch(es) of the configuration unit(s).

Due to the use of the above technical solutions, the present disclosure has the following advantages over the conventional solution:

In the verification system and method for a power amplifier of an vehicular audio system of the present disclosure, when verifying product performance, the channel(s) of the power amplifier to be verified are determined, that is, which audio channel(s) of the audio processor need to place the TDM signal are determined; the configuration unit(s) corresponding to the audio channel(s) are switched to the selected state, and the controller detects and determines which configuration unit(s) are in the selected state, and informs the audio processor which audio channel(s) need to place the TDM signal for testing, and the audio processor correspondingly places the TDM signal on the defined audio channel(s), feeds to the power amplifier, and conducts testing; it is possible to quickly and easily send a standard signal to the corresponding channel, achieving fast product function and performance verification.

BRIEF DESCRIPTION OF THE DRAWINGS

For more clearly explaining the technical solutions in the embodiments of the present disclosure, the accompanying drawings required to be used to in the description of the embodiments will be simply introduced below. Apparently, the drawings in the following description show merely some embodiments of the present disclosure, and those of ordinary skill in the art may derive other drawings from these accompanying drawings without creative efforts.

DETAILED DESCRIPTION OF EXEMPLARY EMBODIMENTS

The preferable embodiments of the present disclosure are explained below in detail combining with the accompanying drawings so that the advantages and features of the present disclosure can be easily understood by the skilled persons in the art. It should be noted that the explanation on these implementations is to help understanding of the present disclosure, and is not intended to limit the present disclosure. Further, the technical features involved in the various embodiments of the present disclosure described below may be combined with each other as long as they do not conflict with each other.

Figure 1:
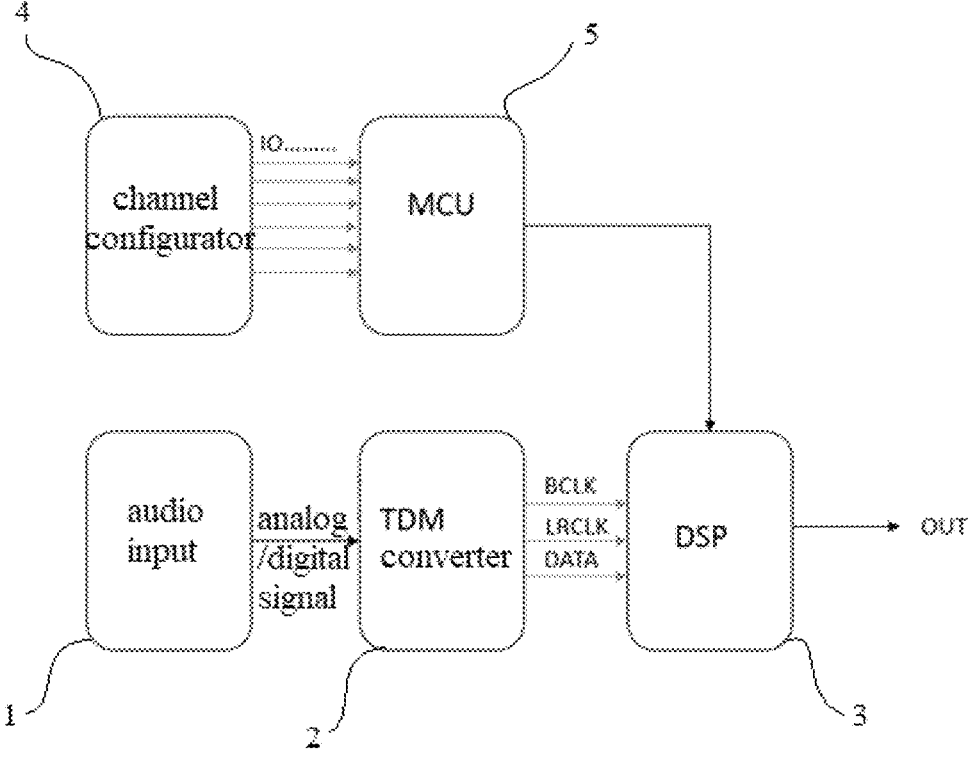
FIG. 1 is a structural block diagram of a power amplifier verification system according to an embodiment of the present disclosure.

Referring to FIG. 1, according to an embodiment of the present disclosure, a system for verifying a power amplifier of a vehicular audio system comprises an audio input module 1, a TDM converter 2, an audio signal processor 3, a channel configurator 4, and a controller 5, all of which are preferably integrated on a single circuit board. This verification system can verify the power amplifier and selectively transmit standard signals to one or more channels of the power amplifier, thereby quickly verifying the function and performance of the product.

The audio input module 1 is used to input audio, which can be an analog signal or a digital signal. Specifically, the audio input module 1 comprises an input port arranged on the circuit board, or the audio input module 1 is an input port arranged on the circuit board.

The TDM converter 2 is electrically connected to the audio input module 1 to convert an audio signal input by the audio input module 1 into a TDM signal. The TDM converter 2 divides a channel into different time slots in time, inserts different pulse signals in different time slots to achieve multiplexing of multi-channel signals in the time domain. The TDM signal can be transmitted by utilizing a single bus and implement multi-channel audio signal transmission.

The audio signal processor 3 is used to receive the TDM signal and select the selected channel to transmit it to the power amplifier as the test signal for the power amplifier; specifically, the audio signal processor 3 is a digital audio processor, which is an audio DSP chip. The input end of the audio signal processor 3 is electrically connected to the output end of the TDM converter 2 via a TDM bus, and the TDM bus comprises a BCLK (serial clock) transmission line, an LRCLK (left and right channel clock) transmission line, and a DATA (data) transmission line. The audio signal processor 3 has N audio channels, N>1; for example, a DSP chip can have 8 audio channels (solts), denoted as solt0, solt1, solt2, solt3, solt4, solt5, solt6, solt7, and solt8. The output end of the audio signal processor 3 is electrically connected to the power amplifier to transmit the test signal to the power amplifier. For example, the DSP chip is electrically connected to the input end of the power amplifier via an A2B bus (automotive audio bus). The DSP chip parses the audio files transmitted by the DATA transmission line of the TDM bus, converts and processes them based on BCLK signals, LRCLK signals, etc., and generates analog signals that can be transmitted to the power amplifier.

Figure 2:
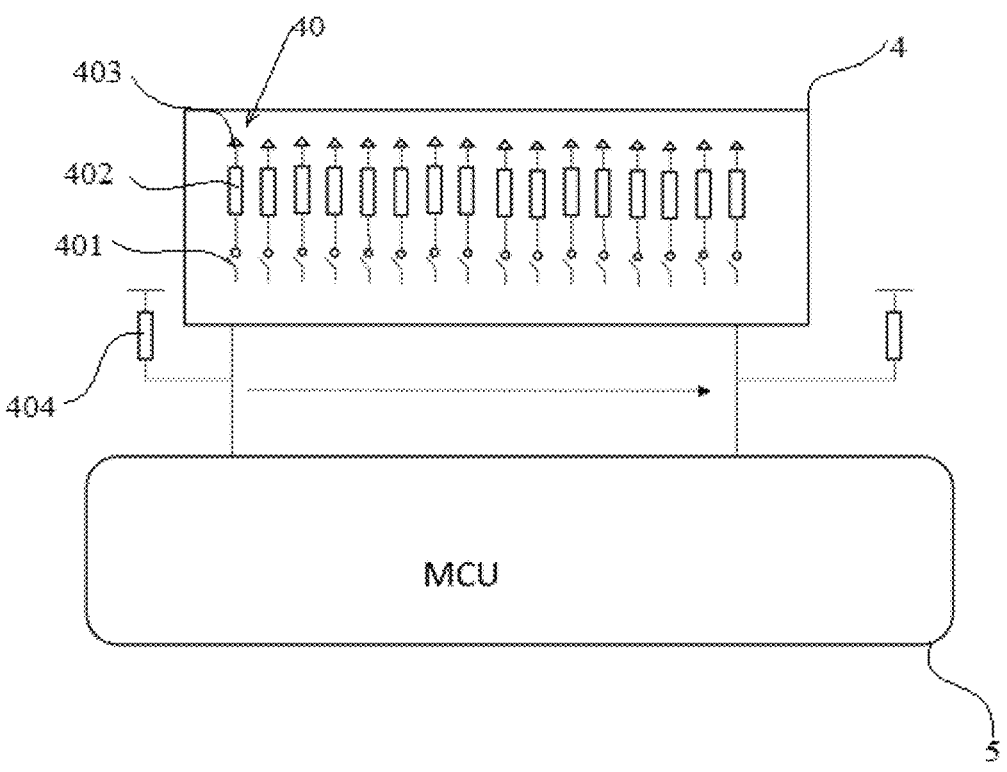
FIG. 2 is a connection circuit diagram of a channel configurator and a MCU chip in FIG. 1.

As shown in FIG. 2, the channel configurator 4 has M configuration units 40, M≥N, the audio signals each corresponds to one of the configuration units 40, and the configuration units 40 each has a selected state and a non-selected state. Specifically in this embodiment, the channel configurator 4 has 16 configuration units 40, of which 8 correspond to 8 solts of the DSP chip for selection of slot; the other 8 are used for audio selection and clock selection. Each channel configurator 4 is electrically connected to a port of the controller 5 correspondingly, such as an I/O port of the MCU chip of the controller 5.

Specifically in this embodiment, each configuration unit 40 comprises a dial switch 401, a first resistor 402, a voltage input terminal 403, and a second resistor 404. A first end of the dial switch 401 is electrically connected to the first resistor 402, and a second end of the dial switch 401 is electrically connected to one of the I/O ports of the MCU chip; by manually switching the on/off of the dial switch 401, the level of this I/O port of the MCU chip can be correspondingly changed, and based on this level, this configuration unit 40 can be determined whether it is in the selected or non-selected state. The first resistor 402 mentioned above is used as a pull-up resistor, and a first end of the first resistor 402 is electrically connected to the voltage input terminal 403 for accessing a pull-up voltage, such as 3.3 V; a second end of the first resistor 402 is electrically connected to the first end of the dial switch 401. A first end of the second resistor 404 is grounded, and a second end of the second resistor 404 is electrically connected to the second end of the dial switch 401 and the intermediate point of the I/O ports of the MCU chip.

The controller 5 is used to determine that each configuration unit 40 is in the selected state or non-selected state and control the audio signal processor 3 to place the TDM signal in the audio channel(s) corresponding to the configuration unit(s) 40 which is in the selected state. Specifically, controller 5 comprises an MCU chip with a plurality of I/O ports, and each configuration unit 40 corresponds and is electrically connected to one I/O port. The MCU chip is electrically connected to the DSP chip via a UART (Universal Asynchronous Receiver/Transmitter) bus to determine which configuration units 40 are in the selected state after detecting changes in the level of I/O, and then inform the DSP chip and control the DSP chip to configure the TDM signal in the audio channels corresponding to these configuration units 40 in the selected state, thereby forming a test signal for the corresponding channels transmitted to the power amplifier.

When verifying product performance, the channels of the power amplifier that need to be verified are determined, that is, which solts on the DSP chip need to place the TDM signal are determined; the dial switches 401 of the configuration units 40 corresponding to these solts are switched off, and the corresponding I/Os on the MCU chip become low-level, indicating that these I/O ports are effective; the MCU chip informs the DSP chip via the UART line which solts to place the TDM signal for testing in, and the DSP chip correspondingly places the TDM signal in these defined solts, feeding to the power amplifier for testing.

Figure 3:
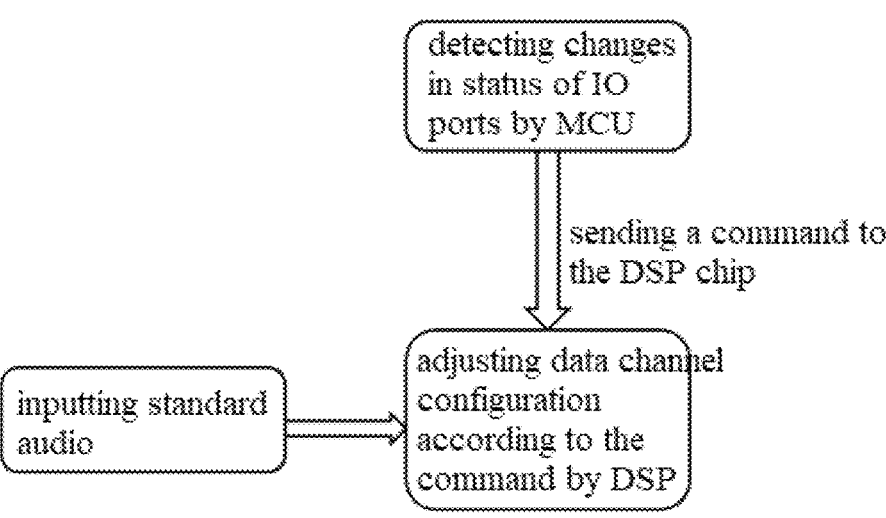
FIG. 3 is a flowchart of a power amplifier verification method according to an embodiment of the present disclosure.

This embodiment further provides a method for verifying a power amplifier of a vehicular audio system, which uses the verification system mentioned above. Referring to FIG. 3, the verification method comprises steps of: according to the one or more audio channels that need to be tested, setting corresponding one or more configuration units 40 to the selected state (specifically, switching off the dial switch(es) 401 of the configuration unit(s) 40), and controlling the audio signal processor 3 via the controller 5 to place the TDM signal in the audio channel(s) corresponding to the configuration unit(s) 40 in the selected state. This verification method can transmit the same audio signal in different solts of the DSP chip. For example, a TDM signal of TDM8 has a total of eight channels of audio data, and the effectiveness of eight channels of information can be tested by determining whether the data is placed in SOLT0 or SOLT1, . . . through the I/O port, respectively, the data can be placed separately in any channel or multiple channels, such as being placed in two or three channels at the same time.

In this embodiment, it is determined which channel of the power amplifier to be tested is represented by each I/O port of the MCU chip, and during the product powering on process, the I/O ports of the MCU chip default to high level (the first resistors 402 are connected to the pull-up voltage of 3.3 V), and when the MCU chip detects that the I/O port(s) have changed from high level to low level, that is, when the dial switch(es) 401 are switched, it means that the I/O port(s) are effective. That is to say, the MCU chip detects changes in the level status of its I/O ports, or knows which channels are to be tested; the MCU chip sends a command to the DSP chip via the UART bus, and the DSP chip places the audio signal used for testing into the defined channels according to the command, and transmits to the channels of the power amplifier to be tested.

As shown in the description and claims of the present disclosure, the terms "comprising" and "containing" only indicate that the clearly identified steps and elements are included, and these steps and elements do not constitute an exclusive list, and the method or device may also include other steps or elements.

It should be further understood that in the present disclosure, "a plurality of" refers to two or more, and other quantifiers are similar.

It can be further understood that the terms "first", "second", etc. are used to describe various information, but this information should not be limited to these terms. These terms are only used to distinguish the same type of information from each other and do not indicate a specific order or degree of importance. In fact, expressions such as "first"

and "second" can be used interchangeably. For example, without departing from the scope of the present disclosure, the first information can also be referred to as the second information, and similarly, the second information can also be referred to as the first information.

The embodiments described above are only for illustrating the technical concepts and features of the present disclosure, are preferred embodiments, and are intended to make those skilled in the art being able to understand the present disclosure and thereby implement it, and should not be concluded to limit the protective scope of this disclosure.

What is claimed is:

1. A system for verifying a power amplifier of a vehicular audio system, comprising:

a time-division multiplexing (TDM) converter for converting an audio signal into a TDM signal;

an audio signal processor for receiving the TDM signal and generating and outputting a test signal for transmitting to the power amplifier, the audio signal processor having N audio channels, N>1;

a channel configurator having M configuration units, M≥N, each of the N audio channels corresponding to one of the M configuration units, and each of the M configuration units having a selected state and a nonselected state; and a controller for determining that each of the M configuration units is in the selected state or the non-selected state and controlling the audio signal processor to place the TDM signal in audio channel(s) corresponding to configuration unit(s) in the selected state.

2. The system according to claim 1, wherein each of the M configuration units comprises a dial switch, and, when the dial switch is switched off, the configuration unit is in the selected state.

3. The system according to claim 2, wherein each of the M configuration units further comprises a first resistor, a first end of the first resistor is electrically connected to a voltage input terminal, a second end of the first resistor is electrically connected to a first end of the dial switch, and a second end of the dial switch is electrically connected to the controller.

4. The system according to claim 3, wherein each of the M configuration units further comprises a second resistor, a first end of the second resistor is grounded, a second end of the second resistor is electrically connected to an intermediate node of the second end of the dial switch and the controller.

5. The system according to claim 3, wherein the controller comprises a plurality of input/output (I/O) ports, and the second end of each dial switch is electrically connected to one of the plurality of I/O ports.

6. The system according to claim 1, wherein the controller is electrically connected to the audio signal processor via a universal asynchronous receiver/transmitter (UART) bus.

7. The verification system according to claim 1, wherein the controller is a micro controller unit (MCU) chip.

8. The system according to claim 1, wherein the audio signal processor is a digital signal processing (DSP) chip.

9. The system according to claim 1, wherein the system further comprises an automotive audio bus for transmitting an output of the audio signal processor to the power amplifier.

10. The system according to claim 1, wherein the system further comprises an audio input module electrically connected to the TDM converter.

11. The system according to claim 1, wherein the TDM converter, the audio signal processor, the channel configurator and the controller are arranged on a circuit board.

12. The system according to claim 11, wherein the circuit board is provided with an input port for inputting audio, and the input port is electrically connected to the TDM converter.

13. The system according to claim 12, wherein;

each of the M configuration units comprises a dial switch, and when the dial switch is switched off, the configuration unit is in the selected state;

each of the M configuration units further comprises a first resistor, a first end of the first resistor is electrically connected to a voltage input terminal, a second end of the first resistor is electrically connected to a first end of the dial switch, and a second end of the dial switch is electrically connected to the controller; and each of the M configuration units further comprises a second resistor, a first end of the second resistor is grounded, and a second end of the second resistor is electrically connected to an intermediate node of the second end of the dial switch and the controller.

14. A method for verifying a power amplifier of a vehicular audio system, utilizing the system according to claim 1, and comprising:

according to one or more of the N audio channels that need to be tested, setting corresponding one or more of the M configuration units to the selected state; and controlling the audio signal processor via the controller to place the TDM signal in the audio channel(s) corresponding to the configuration unit(s) in the selected state.

15. The method according to claim 14, wherein the configuration unit(s) are set to the selected state by switching off a dial switch of the configuration unit(s).

\* \* \* \* \*